United States Patent [19]

Carleer

[11] Patent Number: 5,462,841
[45] Date of Patent: Oct. 31, 1995

[54] TONE RENDITION OF HALFSTONE IMAGES BY PROJECTION EXPOSURE

[75] Inventor: Lode Carleer, Duffel, Belgium

[73] Assignee: AGFA-Gevaert N.V., Mortsel, Belgium

[21] Appl. No.: 228,374

[22] Filed: Apr. 15, 1994

[30] Foreign Application Priority Data

May 19, 1993 [EP] European Pat. Off. .............. 93201431

[51] Int. Cl.⁶ ........................................... G03C 5/04
[52] U.S. Cl. .................. 430/396; 430/264; 430/22; 430/30; 430/327; 101/401.1; 101/395; 359/893
[58] Field of Search ........................ 430/264, 396, 430/22, 30, 327; 101/401.1, 395; 359/893

[56] References Cited

U.S. PATENT DOCUMENTS

| | | | |
|---|---|---|---|
| 4,308,326 | 12/1991 | Wirth | 430/396 |
| 4,708,459 | 11/1987 | Cowan et al. | 430/43 |
| 4,997,733 | 5/1991 | Carleer et al. | 430/396 |
| 5,010,398 | 4/1991 | Nys et al. | 430/22 |
| 5,283,140 | 2/1994 | Netz et al. | 430/264 |

*Primary Examiner*—Thomas R. Neville
*Attorney, Agent, or Firm*—William J. Daniel

[57] ABSTRACT

A method for producing a reproduction in reduced or enlarged size of a halftone original with improved tone rendition by the use of a continuous tone correction mask in conjunction with the halftone original applied in projection exposure.

It is a particular characteristic of the present invention that said improved tone rendition is obtained by using in said projection exposure a mask image, the maximum density (i.e. density at 3% dot value areas of the halftone original used in the projection exposure) is linearly directly proportional to the screen ruling of the halftone original used in the projection exposure (see FIG. 2 and 3).

6 Claims, 5 Drawing Sheets

TONE RENDITION OF HALFSTONE IMAGES BY PROJECTION EXPOSURE

FIELD OF THE INVENTION

The present invention relates to a method for producing a reproduction of a halftone original by projection exposure wherein measures are taken for an improved tonality rendition of the whole tonal scale of the halftone original.

BACKGROUND OF THE INVENTION

In the preparation of photomechanical printing plates black-and-white halftone colour separation prints are used as photomasks in the production of printing plates for printing with subtractive colour printing inks. Inks of the subtractive colours cyan, magenta and yellow are used, as well as a certain amount of black ink applied by black printer.

The amount and distribution pattern of any one of the printing inks used in conjunction with the different printing plates for multicolour printing depends on the dot size distribution in the printing plates, which distribution in turn depends on the dot size distribution in the black-and-white halftone colour separation used as a photomask in the photo-exposure for making the plate.

In some cases the available halftone separations need enlargement on films or printing plates, e.g. for use in the production of large size posters, advertisement panels, large format publications or needs reduction or enlargement for adapting the format between different publications.

The production of halftone separations at reduced or enlarged size proceeds usually by projection exposure in a graphic art camera. In practice the halftone separations require frequently adaptation in size in the range of 70 to 600% with respect to the original.

Halftone reproduction by optical projection exposure in an enlargement camera is associated with a problem in that a correct reproduction of the whole tonal scale of the screen dot pattern of the halftone original used in the projection exposure is impossible. For example, an exposure dose resulting in a correct reproduction of halftone areas having a 50% dot value results in an overexposure in the areas having a % dot value higher than 50, and results in an underexposure in the areas having a % dot value lower than 50.

OBJECTS AND SUMMARY OF THE INVENTION

It is an object of the present invention to provide a method for producing a reproduction of a halftone original by projection exposure wherein measures are taken for an improved tonality rendition of the whole tonal scale of the halftone original.

According to the present invention there is provided a method for producing a reproduction of a halftone original by projection exposure comprising the steps of:

(1) photo-exposing a silver halide emulsion film material, called mask film, through a halftone image, i.e. formed of screened dots, having during the exposure the silver halide emulsion layer of the mask film in close proximity to said halftone image so that in the mask film a latent mask image is formed as a descreened image, (i.e. free of screen dots i.e. continuous tone image), the photo-exposure dose used for preparing said mask image being determined via a linear relationship of the screen ruling size of said halftone original versus the maximum optical density that the mask has to have (in order to achieve said tonality rendition improvement) in an area corresponding to an area of the original having a dot value in the range of 0 to 10% dot, (2) developing the latent mask image in the thus exposed mask film to produce a correction mask under such conditions that an image of opposite image values with respect to the halftone original used in the projection exposure is obtained and such that when said close-proximity exposure is carried out through a sensitometric continuous tone wedge a wedge reproduction is obtained wherein the sensitometric curve (Density versus log E) is characterized by a Density/Gradient relationship expressed in following Table A:

| Density | Gradient |
|---------|----------|
| 0.05    | 0.18     |
| 0.10    | 0.43     |
| 0.15    | 0.57     |
| 0.20    | 0.69     |
| 0.25    | 0.81     |
| 0.30    | 0.94     | with the proviso the gradient values may deviate by a factor from 0.5 to 2 from the values mentioned in said Table A, (3) projection-exposing a photo-sensitive printing plate material or a silver halide emulsion film material through an assemblage of said halftone original in image registration with said developed mask film, called correction mask, and (4) carrying out high-contrast development of the latent enlarged halftone image in the thus exposed film material or photo-sensitive printing plate material.

In the developed correction mask image the optical density (D) between the area(s) corresponding with 3% dot value and areas corresponding with a higher % dot value than 3 in said halftone original is such that by carrying out the steps (3) and (4) a halftone reproduction with better fidelity in tonality-rendition is obtained than would have been the case by carrying out the projection exposure of the correction step (3) without said mask image.

By high-contrast development is meant that when the projection exposure of step (3) through said halftone original and correction mask proceeded also through a combination of said halftone original and a sensitometric continuous tone wedge by said development a wedge reproduction is obtained the gradation curve of which is characterized by a maximum gradient of the sensitometric curve of at least 6, preferably of at least 10.

In an embodiment of the present invention said improved tonality-reproduction is obtained by using in said projection exposure a correction mask image wherein the maximum density in areas corresponding to the 3% dot value areas of the halftone original used in the projection exposure is linearly directly proportional to the screen ruling size of the halftone original as shown in present FIG. 2.

DETAILED DESCRIPTION OF THE INVENTION

The contact-exposure for producing the de-screened (continuous tone) correction mask image is an exposure with diffuse light.

Figure 5:
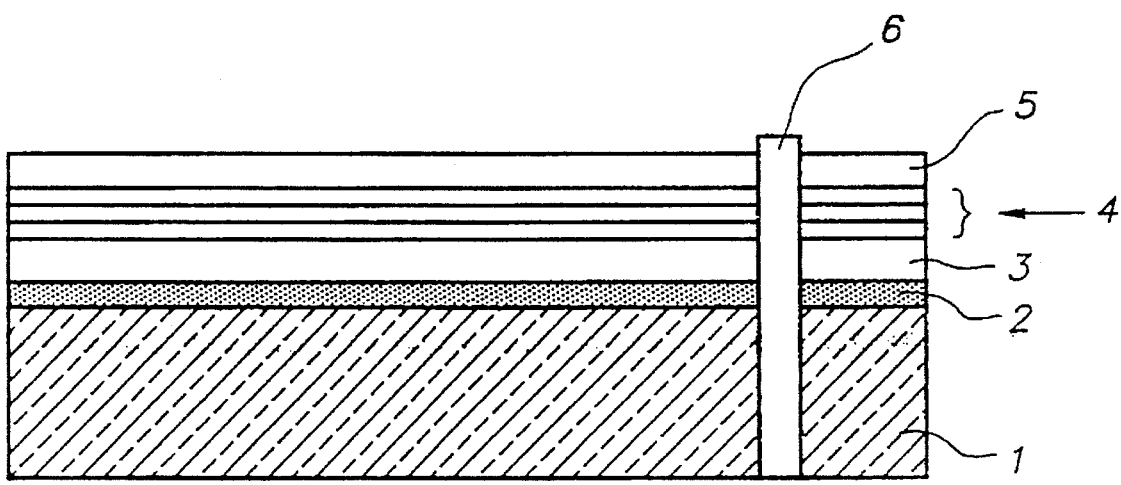
FIG. 5 represents a schematic cross-sectional drawing of a close-proximity exposure for obtaining a continuous tone (i.e. descreened) mask according to the present invention. Descreening proceeds while having during the exposure at least one transparent spacing sheet in between the halftone image and the mask film.

For that purpose in a practical embodiment the glass platen (film support) of the contact exposure apparatus may be covered with a light-scattering (mat) translucent resin film and the exposure of the mask film is effected in close proximity through one or more clear films having a total thickness in the range of 0.1 to 0.5 mm. Said contact-exposure arrangement is shown in FIG. 5 which represents a schematic cross-sectional drawing in which element 2 is said light-scattering (mat) film in contact with the glass platen 1 of the contact-exposure apparatus. Element 3 is the halftone (screened) original and element 4 is a pile of three clear spacer films representing a total thickness of 0.3 mm and having on top for producing the correction mask a negative-working silver halide room light film 5, all said elements for registration purposes being held by register pins, one being shown as element 6.

As a result of the unsharp light exposure carried out in this manner, in the mask all the "screen" information from the halftone original is removed and the correction mask is free from dot structure and is thus a continuous tone image.

By "integrated halftone density" is meant the integral density measured by a spot densitometer on a small surface area of the halftone image. The minimum size of the densitometer aperture must meet the requirement that at least 15 dots are measured at the same time.

A comparison between dot size and percentage dot area and proper densitometer aperture for screen rulings from 10 to 150 lines/cm is given by Ewald Fred Noemer in The Handbook of Modern Halftone Photography, Publisher: Perfect-Graphic-Arts Supply Company P.O. Box 62 Demarest, N.J. 07627 (1965), p. 97–98.

The unscreened continuous tone mask image prepared according to the present invention controls the exposure dose of the projection exposure in correspondence with the locally different tonality of said halftone original in such a way that a substantially improved reproduction of halftone tonality over the whole scale of % dot values in the reproduction is obtained.

Figure 1:
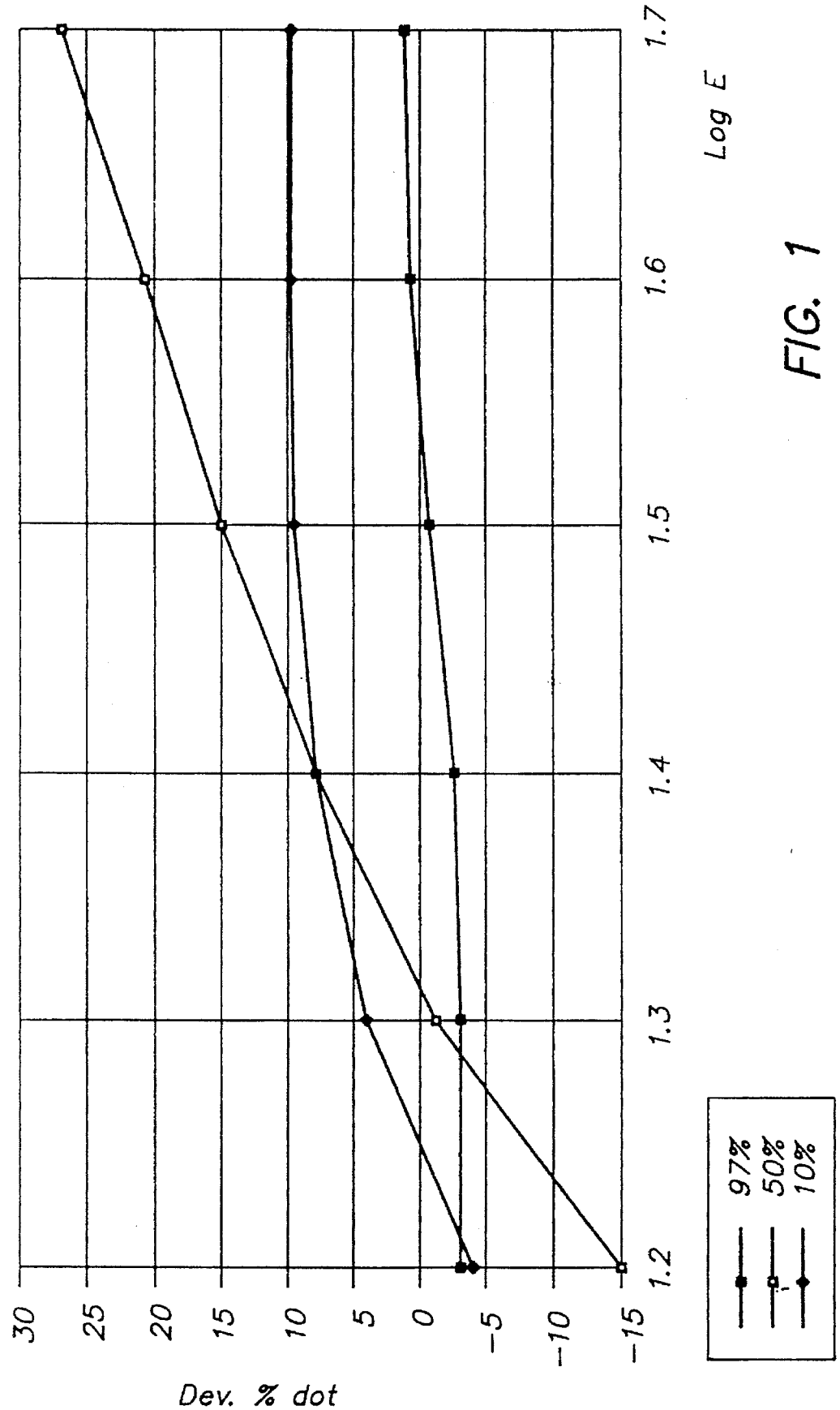
FIG. 1. represents a graph illustrating the deviation (increment or decrement) in % dot value (Dev. % dot) plotted in the ordinate versus applied log exposure dose (log E) in the abscissa. The graph relates to an embodiment wherein the size reduction by projection exposure is 70% and the halftone original used in the size reduction has a screen ruling of 51 lines/cm. The graph relates to a projection exposure situation wherein a "negative" halftone image is to be combined with the descreened correction mask to yield a positive reproduction according to the principles of "negative-positive" photographic reproduction with photographic silver halide emulsion layer materials. The % dot deviation (Der. % dot) at dot values of 10, 50 and 97% is for said "negative-positive" reproduction plotted against increasing exposure doses (log E). The correct exposure dose at 50% dot value is about 1.3. A correct dot reproduction in the final halftone positive requires in the 10% dot value areas of the "negative" original a reduced exposure dose, whereas in the 97% dot value areas the exposure dose has to be increased.

As can be learned from FIG. 1 the exposure dose (log E) required for a negative-positive reproduction having correct dot size rendition (i.e zero Dev. % dot) has to be at 10% dot value substantially lower than for correct dot rendition at 50 and 97% dot value. Based on these experimental findings the correction mask prepared according to the present invention must have its highest density in correspondence with the 3% dot value areas (low density parts) of the halftone original used in the projection exposure and must have its minimum density in correspondence with the 97% dot value areas (high density parts) of the halftone original to be reproduced in negative-positive reproduction by projection exposure (see FIG. 3).

The density increase of the mask image in correspondence with the halftone tonality range from 3 to 97% dot value is determined by the gradation curve of the mask image which is numerically expressed in said Table A by the therein presented density and corresponding gradient values.

Actually said mask brings about an underexposure in said lower % dot value areas with respect to 50% dot value and an overexposure in the higher dot value areas hereby resulting in correct dot size reproduction over the whole tonality scale.

In the following Table 1 maximum densities of correction masks at 3% dot value are given in the circumstances wherein the masks have zero density for a correct 97% dot rendition in projection enlargement exposure through the halftone original.

Said Table 1 contains said densities correlated to halftone originals of different screen ruling (varying from 27 to 58 lines/cm) and different percentages of enlargement (varying from 70 to 200%).

TABLE 1

| SCREEN RULING of ORIGINAL | DENSITY OF MASK AT 3% DOT VALUE Percent Degree of Enlargement | | | |
|---|---|---|---|---|
| Lines/cm | 70% | 100% | 150% | 200% |
| 27 | 0.11 | 0.10 | 0.12 | 0.09 |
| 30 | 0.14 | 0.12 | 0.15 | 0.12 |
| 39 | 0.22 | 0.19 | 0.23 | 0.20 |
| 41 | 0.24 | 0.21 | 0.24 | 0.22 |
| 48 | 0.29 | 0.27 | 0.31 | 0.29 |
| 51 | 0.32 | 0.29 | 0.33 | 0.32 |
| 58 | 0.37 | 0.36 | 0.38 | 0.39 |

From Table 1 can be learned that maximum density for a given screen ruling is almost independent of the degree of enlargement (compare the density values across any horizontal line of Table 1).

Figure 2:
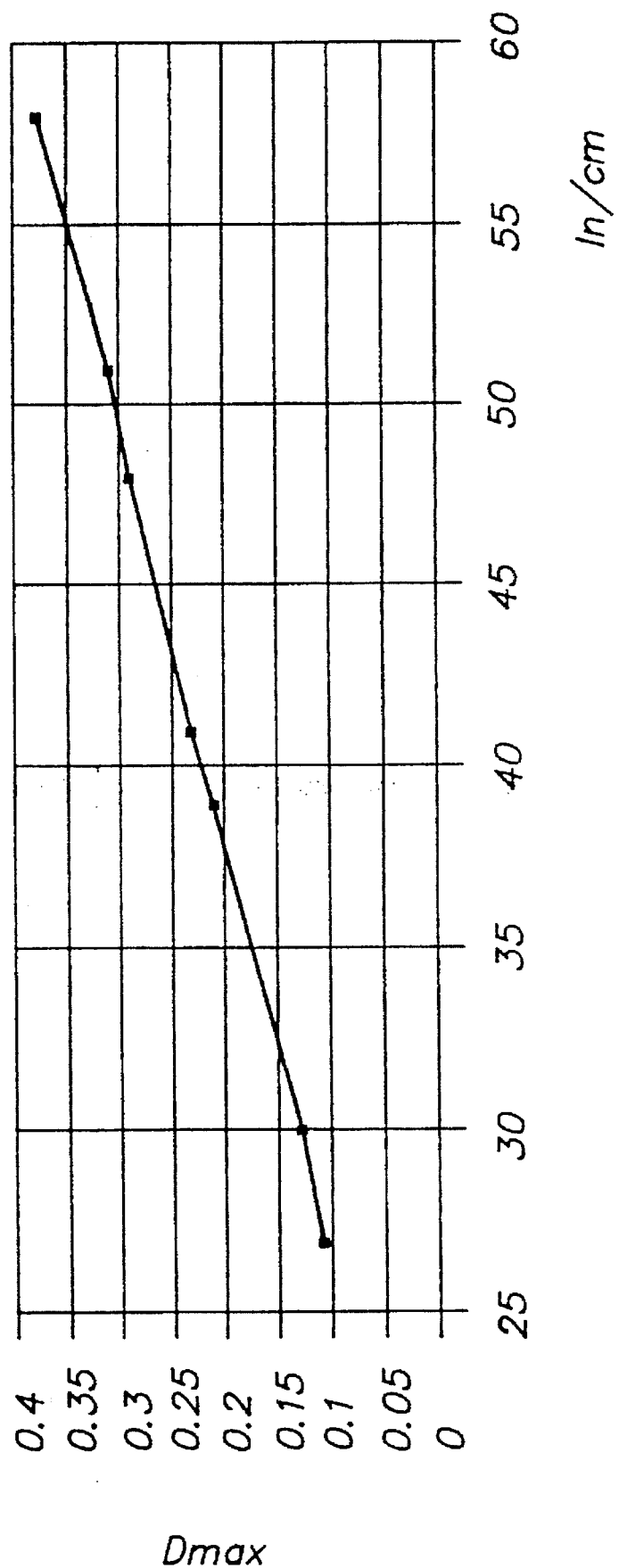
FIG. 2 represents a graph wherein maximum density ($D_{max}$) values of different correction masks produced according to the present invention are plotted in the ordinate and screen ruling as lines per cm (ln/cm) of different halftone originals to be reproduced by projection exposure are plotted in the abscissa.

It has been found experimentally by us that there is a linear direct proportionality between the required maximum density of the mask and the screen ruling of the halftone original; such is shown by graph in FIG. 2.

Figure 3:
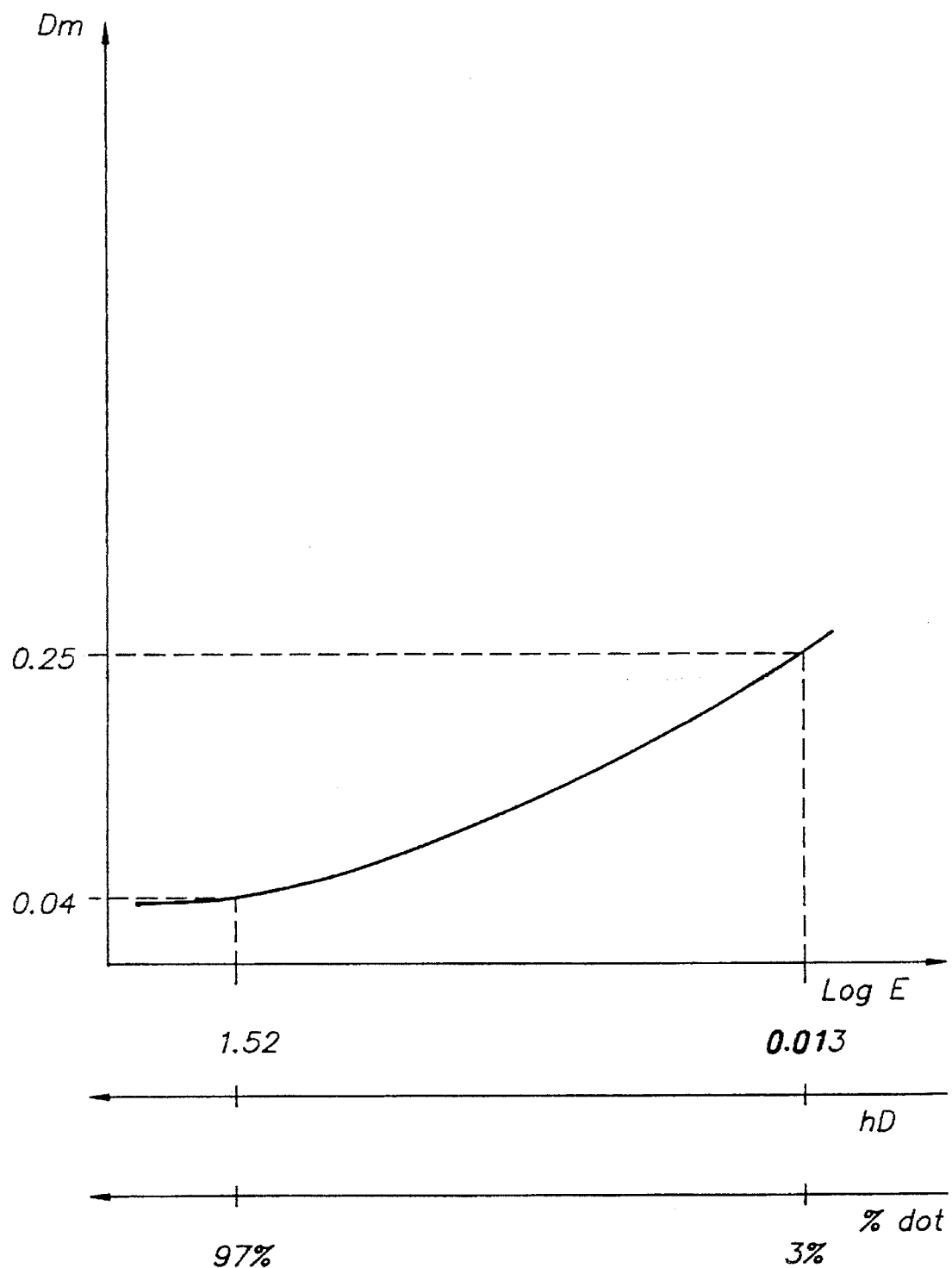
FIG. 3 represents the sensitometric curve of the density of the correction mask (Dm) in ordinate versus log exposure dose (log E) in abscissa of said correction mask image obtained in a silver halide emulsion layer mask film for use according to the present invention. The log E values in the abscissa are correlated with the integrated halftone density (hD) and corresponding dot percentage value (% dot) of the halftone original to be reproduced in the projection exposure.
Figure 4:
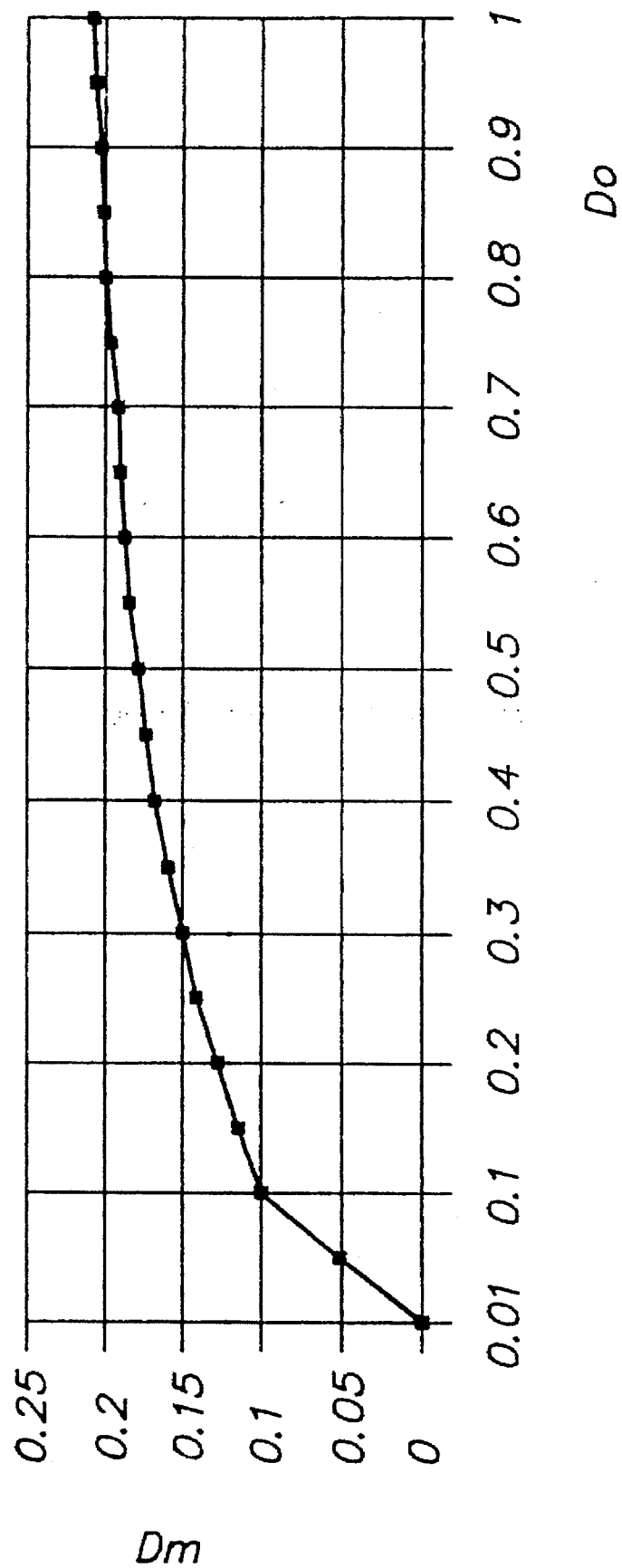
FIG. 4 represents a graph wherein in the abscissa the density course (Do) of an halftone original with screen ruling of 41 lines/cm and which is to be enlarged by 150% is plotted against the density course (Dm) of the (descreened) continuous tone correction mask used according to the present invention.

In FIG. 3 the sensitometric curve of a continuous tone mask suitable for use according to the present invention in combination with halftone originals having a screen ruling of 41 lines/cm is illustrated. According to said FIG. 3 the sensitometric curve (D/log E curve) is characterized by a mask density range of 0.21 and the maximum gradient at density 0.25 is about 0.80.

Said sensitometric curve relates to an image obtained in a fairly low contrast developed negative-working black-and-white silver halide emulsion material. The log E values in the abscissa are correlated with the integrated halftone density (hD) and corresponding % dot value of the halftone original used in the enlargement exposure.

The continuous tone correction mask used according to the present invention may be produced on a negative-working or positive working silver halide emulsion material but must always have reversed image-values with respect to the image values of the halftone original used in the projection exposure.

In order to exclude as much as possible any effects of darkroom operating conditions in the production of the correction mask preference is given to a mask film having the properties of a so-called room light film, which is a film that can be handled in normal room light without fogging but is still sensitive enough for exposure in a contact-exposure camera with the usual light-sources. Examples of such films are described e.g in Research Disclosure, March 1978, item 16,735. Due to the absence of spectral sensitization those materials can be handled in bright yellow light without fogging.

The information necessary for determining an appropriate exposure dose to be given through the mask film and halftone original to be enlarged can be computer controlled using a software program based on previously executed test exposure conditions and the desired results taking into account: (1) screen ruling of the halftone original, (2) enlargement degree, (3) film sensitivity, (4) the exposure characteristics of the light source of the exposure device (enlargement camera) and (5) film processing conditions.

For each lot of mask film, one may obtain an exposure factor calibrated with respect to the exposure apparatus and the sensitometric results that are achieved therewith under particular development processing conditions. Each enlargement camera can be associated with a micro-processor chip that serves for direct exposure control using an appropriate software program.

The invention is illustrated by the following example without however limiting it thereto.

EXAMPLE

From a multicolour continuous tone transparency by contact screen exposure (screen ruling 39 lines/cm) positive halftone separation images corresponding with the cyan, magenta and yellow image content (halftone cyan printer, halftone magenta printer and halftone yellow printer images) were made. From said positive halftone separation images same size negative halftone images serving as originals in the projection exposure for enlargement were made by contact-exposure.

From each of said negative halftone images 150% positive enlargements had to be made. The following procedure was followed for each halftone image.

(I) a low gradation type (negative-working) silver halide emulsion film material marketed under the tradename PRINTON DL 210p by Agfa-Gevaert N.V. Belgium was contact-exposed as illustrated in having schematic cross-sectional drawing identified as FIG. 5. In said drawing element 1 is a glass platen of a contact-exposure apparatus having a light-source (not shown in the drawing) underneath the glass platen 1. The glass platen 1 has on top in the following order: a mat resin film as light-scattering means, the halftone original (transparency) 3, a pile 4 of clear resin foils each having a thickness of 0.10 mm, and said low gradation type film 5 for forming the unscreened a correction mask. The materials 2 to 5 are kept in registration by means of registration pens 6 (one being shown in the drawing).

The contact exposure apparatus contained a 1000 W halogen-metal lamp at a distance of 50 cm from the silver halide emulsion film.

As can be derived from the experimental curve of FIG. 2 a maximum density of 0.21 in the mask image is necessary for the correct tonality reproduction of said halftone image serving as original in the projection exposure (a screen ruling of 39 ln/cm corresponds with a mask density of 0.21). The exposure dose (log E) of the mask film to attain that maximum density of 0.21 is in a common way derived from the sensitometric curve (density versus log E) of the mask film under the selected development conditions.

The exposed film was developed in a common normal contrast developer containing 1-phenyl-3-pyrazolidinone and hydroquinone.

By said contact-exposure and development a continuous tone (descreened) correction mask was obtained having a density of 0.04 above fog in the areas corresponding with 97% dot value of the halftone negative and density of 0.21 in the areas corresponding with 3% dot value of the halftone negative to be enlarged.

(II) In an enlargement camera KLIMSCH Superautovertical T (tradename) a silver halide emulsion film material with high contrast rendition capability AGFASTAR (tradename of Agfa-Gevaert N.V. Belgium) was projection-exposed with 70% enlargement through an assemblage of said developed mask film in image register with said halftone original.

The exposed film was developed in a high-contrast developer as described in U.S. Pat. No. 4,756,990.

By effecting the projection exposure of said halftone original likewise through a sensitometric continuous tone wedge a wedge reproduction therefrom is made the gradation curve of which is characterized by a maximum gradient (straight line gradient) of 12.

The above procedure was repeated for 100, 150 and 200% enlargement. In the following Table 2 the % dot deviation in correspondence with 3, 10, 30, 50, 70 and 90% dot areas of the halftone positive original are given.

For comparison purpose the % dot deviation without use of correction mask in the enlargement of 150% is given in Table 3.

TABLE 2

| | Dot value area and corresponding % dot deviation for screen ruling of 51 lines/cm | | | | | |
|---|---|---|---|---|---|---|
| Enlargement | 3% | 10% | 30% | 50% | 70% | 90% |
| 70% | −1 | 0 | +1 | 0 | +1 | +1 |
| 100% | −1 | +1 | +1 | 0 | 0 | −1 |
| 150% | 0 | +1 | +1 | 0 | 0 | −1 |
| 200% | 0 | +1 | +1 | 0 | 0 | 0 |

TABLE 3

| | Dot value area and corresponding % dot deviation for screen ruling of 51 lines/cm | | | | | |
|---|---|---|---|---|---|---|
| Enlargement | 3% | 10% | 30% | 50% | 70% | 90% |
| 150% | −3 | −3 | −2 | 0 | +5 | +4 |

I claim:

1. A method for producing by projection exposure of a screened halftone original a reproduction with improved tonality rendition comprising the steps of:

a. Photo-exposing a silver halide emulsion mask film material to said halftone original while the silver halide emulsion layer of the mask film is in close proximity to said halftone original so that a latent screen-free continuous mask image is formed in the mask film, the dose for said photo-exposure being determined by means of a linear relation between the screen ruling size of said halftone original and the maximum optical density that the mask image is required to have in an area corresponding to an area of the original having a dot value in the range of 0–10% dot, b. Photographically developing said latent mask image in the thus exposed mask film to produce a correction mask, the developing conditions being such that an image of opposite image values with respect to said halftone original is obtained and such that when said close proximity exposure is carried out through a sensitometric wedge continuous tone wedge, a wedge reproduction is obtained wherein the sensitometric curve (Density vs. log E) has a Density/Gradient relationship as in the following Table A:

| Density | Gradient |
|---|---|
| 0.05 | 0.18 |
| 0.10 | 0.43 |
| 0.15 | 0.57 |
| 0.20 | 0.69 |
| 0.25 | 0.81 |
| 0.30 | 0.94 | with the proviso that said density values may deviate from those specified in Table A by a factor from 0.5–2;

c. Projection-exposing a photo-sensitive printing plate or a silver halide emulsion film material through an assembly in imagewise registration of said halftone original and said correction mask; and d. Photographically developing the projection-exposed material under high-contrast development conditions to form reproduction with improved tonality rendition.

2. Method according to claim 1, wherein the linear relationship between the screen ruling size of said halftone original and the maximum optical density that the correction mask has to have in an area corresponding to a 3% dot value area of said original corresponds to FIG. 2 of the drawings.

3. Method according to claim 1, wherein said mask film is a negative-working silver halide emulsion film and said halftone original is a negative of a positive halftone separation image used for the production of color prints.

4. Method according to claim 3, wherein said negative-working silver halide emulsion film is substantially insensitive to room light.

5. Method according to claim 1, wherein said close proximity photo-exposure is with diffuse light providing said exposure dose.

6. Method according to claim 1, wherein the exposure in steps (1) and (3) is determined by a programmed computer in conjunction with a data memory device.

\* \* \* \* \*